(12) United States Patent
Tsai et al.

(10) Patent No.: US 11,283,231 B2
(45) Date of Patent: Mar. 22, 2022

(54) CLAMPING MODULE AND CLAMPING SYSTEM

(71) Applicant: GIGA-BYTE TECHNOLOGY CO., LTD., New Taipei (TW)

(72) Inventors: Hsing-Feng Tsai, New Taipei (TW); Yen-Yun Chang, New Taipei (TW); Tsung-Ta Wu, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 288 days.

(21) Appl. No.: 16/538,836

(22) Filed: Aug. 13, 2019

(65) Prior Publication Data

US 2020/0161823 A1 May 21, 2020

(30) Foreign Application Priority Data

Nov. 20, 2018 (TW) .................................. 107141207

(51) Int. Cl.
*B23P 19/00* (2006.01)
*H05K 13/04* (2006.01)
*H01R 43/26* (2006.01)
*H01R 12/73* (2011.01)

(52) U.S. Cl.
CPC ........... *H01R 43/26* (2013.01); *H01R 12/737* (2013.01); *H01R 2201/20* (2013.01)

(58) Field of Classification Search
CPC .. H01R 43/26; H01R 2201/20; H01R 12/737; G01R 31/2808; G11C 29/56016
See application file for complete search history.

(56) References Cited

U.S. PATENT DOCUMENTS

| | | | | |
|---|---|---|---|---|
| 6,354,848 B1* | 3/2002 | Billman | ................. | H01R 12/00 439/79 |
| 8,059,406 B1* | 11/2011 | Meyer, IV | .......... | H01L 23/4093 361/701 |
| 2009/0135565 A1* | 5/2009 | Legen | ....................... | G06F 1/20 361/715 |
| 2010/0134982 A1* | 6/2010 | Meyer, IV | .......... | H01L 23/3672 361/715 |

FOREIGN PATENT DOCUMENTS

| | | | |
|---|---|---|---|
| CN | 109031009 A | * | 12/2018 |
| TW | 201119810 | | 6/2011 |
| TW | 201504014 | | 2/2015 |
| TW | M567171 | * | 9/2018 |

\* cited by examiner

*Primary Examiner* — Paul D Kim
(74) *Attorney, Agent, or Firm* — JCIPRNET (57) ABSTRACT

A clamping module is adapted to clamp a memory module and insert or remove the memory module into/from a slot. The clamping module includes a main body, two jaw clamps and a blocking pressing plate. The two jaw clamps are movably disposed on the main body and adapted to move in relative to each other to clamp or release the memory module. The blocking pressing plate is movably disposed on the main body, wherein after the two jaw clamps clamp the memory module to a position in contact with the slot, the two jaw clamps moves away from each other so that the memory module is released and the blocking pressing plate moves from a first position to a second position in order to press the memory module so that the memory module is inserted into the slot.

6 Claims, 6 Drawing Sheets

CLAMPING MODULE AND CLAMPING SYSTEM

CROSS-REFERENCE TO RELATED APPLICATION

This application claims the priority benefit of Taiwan application serial no. 107141207, filed on Nov. 20, 2018. The entirety of the above-mentioned patent application is hereby incorporated by reference herein and made a part of this specification.

TECHNICAL FIELD

The disclosure relates to a clamping module and a clamping system, and more particularly, to a clamping module and a clamping system for a memory module.

BACKGROUND

In the past, when compatibility between memory modules and a computer system is to be tested, an operator needs to perform a compatibility test by repeatedly inserting one or more memory modules into a motherboard of the computer system and executing multiple testing programs. However, as memory module manufacturers have appeared in large numbers with the development of technology, it is required to perform the compatibility test on various memory modules for computer systems with different configurations. Since the operator needs to spend a lot of time in order to complete the compatibility test, labor costs will increase significantly in disguised form. Besides, with working hours of the operator taken into consideration, it is impossible to carry out the compatibility test around the clock without any interruption.

SUMMARY

The disclosure provides a clamping module and a clamping system that can automatically insert and remove a memory module and automatically execute a plurality of compatibility testing programs.

The disclosure provides a clamping module adapted to clamp a memory module and insert or remove the memory module into/from a slot. The clamping module includes a main body, two jaw clamps and a blocking pressing plate. The two jaw clamps are movably disposed on the main body and adapted to move in relative to each other to clamp or release the memory module. The blocking pressing plate is movably disposed on the main body, wherein after the two jaw clamps clamp the memory module to a position in contact with the slot, the two jaw clamps moves away from each other so that the memory module is released and the blocking pressing plate moves from a first position to a second position in order to press the memory module so that the memory module is inserted into the slot.

In an embodiment of the disclosure, the clamping module further includes: two push rods, movably disposed on the main body, wherein two buckle members are rotatably disposed on two sides of the slot and adapted to fix the memory module inserted in the slot or push the memory module away from the slot, and when the memory module is inserted in the slot, the push rods are adapted to move in a direction towards the slot and push against the two buckle members so that the memory module is ejected.

In an embodiment of the disclosure, when the push rod pushes against the two buckle members of the slot, the pushing pressing plate is located at a third position between the first position and the second position to limit a height at which the memory module is ejected.

In an embodiment of the disclosure, the memory module has two notches, and the two jaw clamps are adapted to be embedded in the two notches to clamp the memory module.

In an embodiment of the disclosure, a shell cover is fixed on the memory module and encases at least part of the memory module, and the two jaw clamps are adapted to clamp the shell cover fixed on the memory module.

The disclosure provides a clamping system adapted to clamp a memory module and insert or remove the memory module into/from a slot. The clamping system includes a mechanical arm and a clamping module. The mechanical arm is adapted to move along at least two axes. The clamping module is coupled to the mechanical arm. The clamping module includes a main body, two jaw clamps and a blocking pressing plate. The two jaw clamps are movably disposed on the main body and adapted to move in relative to each other to clamp or release the memory module. The blocking pressing plate is movably disposed on the main body, wherein after the two jaw clamps clamp the memory module to a position in contact with the slot, the two jaw clamps moves away from each other so that the memory module is released and the blocking pressing plate moves from a first position to a second position in order to press the memory module so that the memory module is inserted into the slot.

In an embodiment of the disclosure, the clamping module further includes: a push rod, movably disposed on the main body, wherein two buckle members are rotatably disposed on two sides of the slot and adapted to fix the memory module inserted in the slot or push the memory module away from the slot, and when the memory module is inserted in the slot, the push rod is adapted to move in a direction towards the slot and push against the two buckle members so that the memory module is ejected.

In an embodiment of the disclosure, when the push rod pushes against the two buckle members of the slot, the pushing pressing plate is located at a third position between the first position and the second position to limit a height at which the memory module is ejected.

In an embodiment of the disclosure, the memory module has two notches, and the two jaw clamps are adapted to be embedded in the two notches to clamp the memory module.

In an embodiment of the disclosure, a shell cover is fixed on the memory module and encases at least part of the memory module, and the two jaw clamps are adapted to clamp the shell cover fixed on the memory module.

Based on the above, the clamping module and the clamping system of the disclosure adopt the two jaw clamps for clamping the memory module together with the blocking pressing plate and the push rods for inserting the memory module into the slot. Moreover, the operation of repeatedly and manually clamping or releasing the memory module is performed by the mechanical arm instead. As a result, not only can the manpower input be reduced, the time required for the testing process may also be reduced due to regular and precise mechanical operation.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Reference will now be made in detail to the present preferred embodiments of the disclosure, examples of which are illustrated in the accompanying drawings. Wherever possible, the same reference numbers are used in the drawings and the description to refer to the same or like parts.

Figure 1:
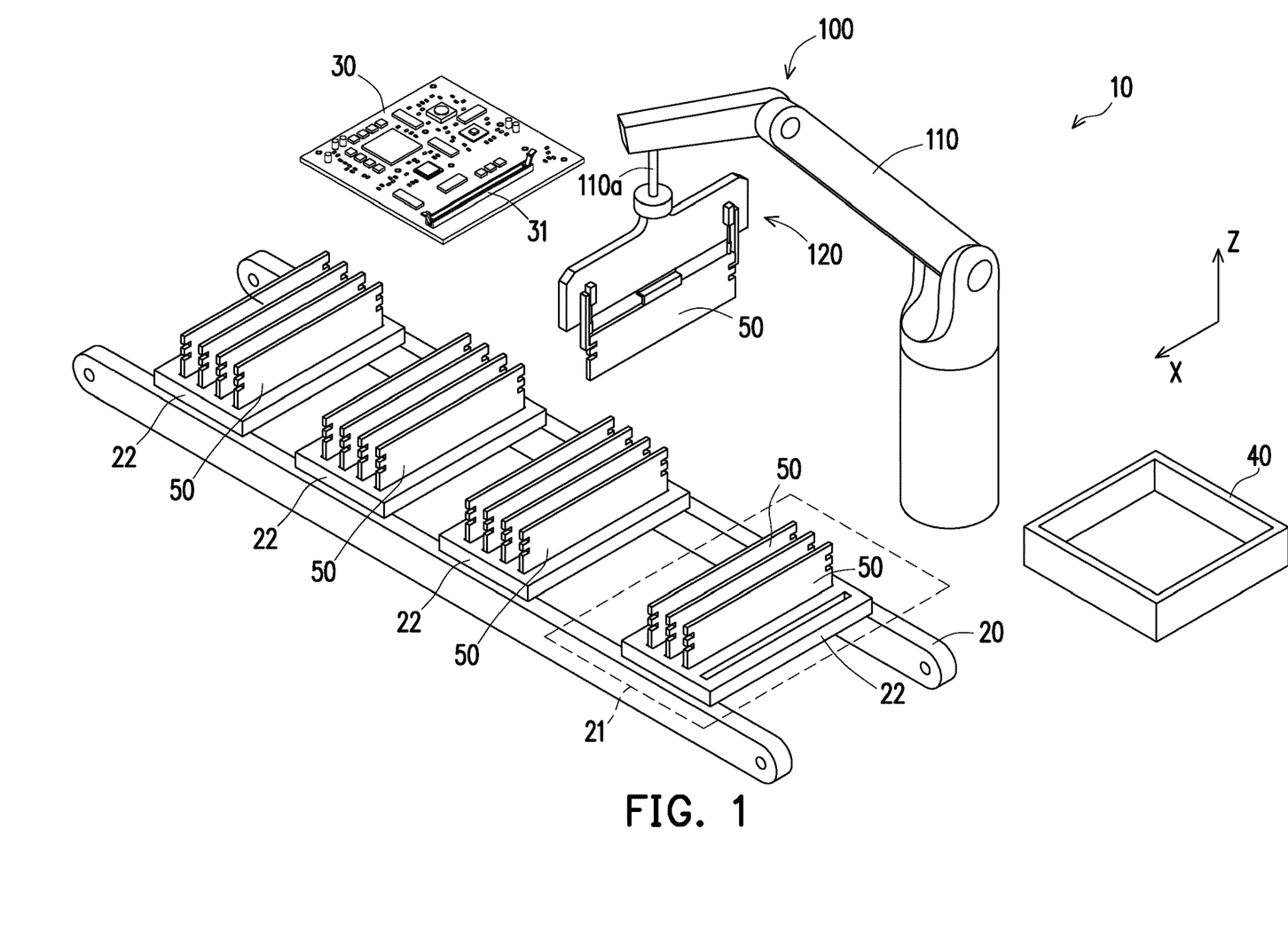
FIG. 1 is a schematic diagram of a clamping system and a memory module testing assembly thereof according to an embodiment of the disclosure.

FIG. 1 is a schematic diagram of a clamping system and a memory module testing assembly thereof according to an embodiment of the disclosure. Referring first to FIG. 1, the following briefly describes an operation process of a memory module testing assembly 10 of the disclosure is briefly described. The memory module testing assembly 10 has a clamping system 100 adapted to clamp one or more of a plurality of memory modules 50 in a sample zone 21 located on a production line 20 onto a to-be-test motherboard 30, wherein the memory modules 50 are located on a tray 22 in the sample zone 21. After the clamping system 100 correspondingly inserts one or more of the memory modules 50 into one or more of a plurality of slots 31 (for illustrative convenience, only one of which is illustrated in the drawing) of the to-be-tested motherboard 30, the to-be-tested motherboard 30 starts to perform a compatibility test on one or more of the memory modules 50 for the to-be-tested motherboard 30. After the compatibility test is completed, whether one or more of the memory modules 50 are compatible with the to-be-tested motherboard 30 is determined according to a testing result. If compatible, one or more of the tested memory modules 50 are clamped back to the tray in the sample zone 21 by the clamping system 100. If incompatible, one or more of the tested memory modules 50 are clamped to a defective sample zone 40 by the clamping system 100. Then, the production line 20 moves to bring the memory modules 50 in another tray 22 to the sample zone 21 to be clamped by the clamping system 100.

Figure 2:
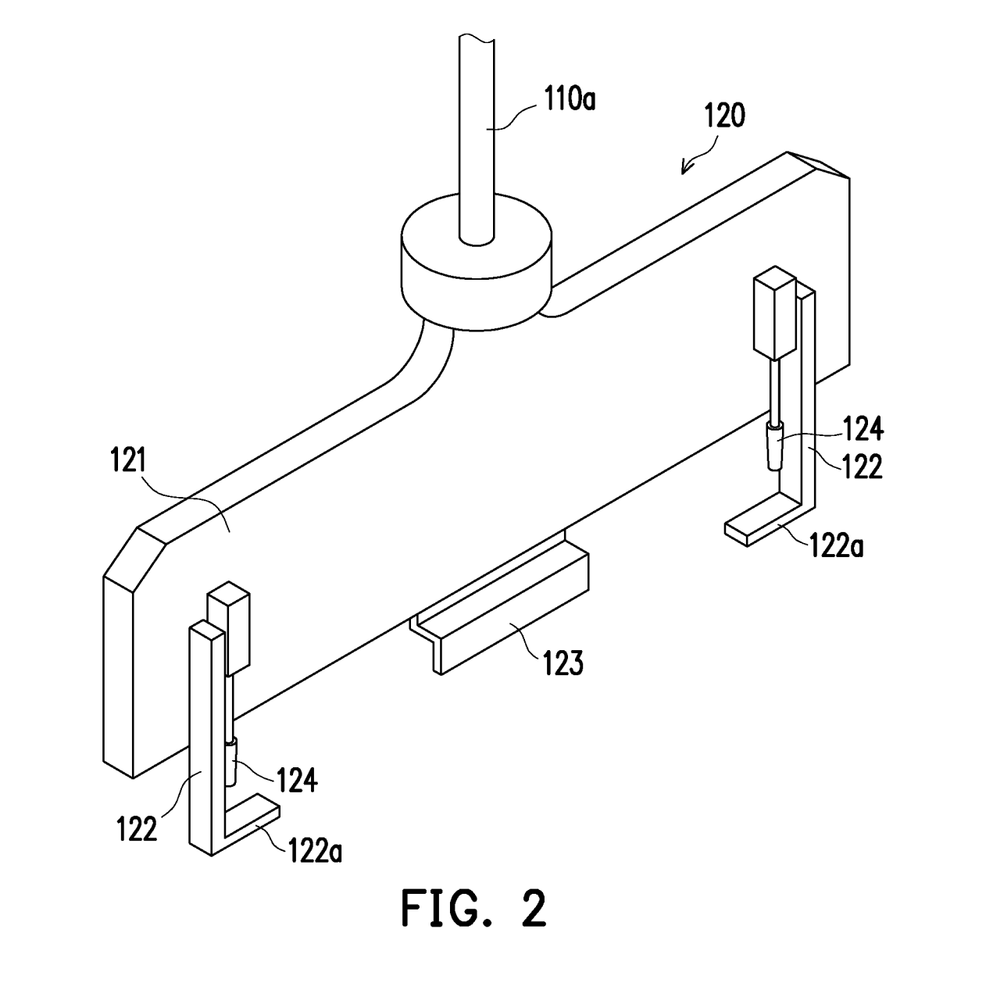
FIG. 2 is a schematic diagram of a clamping module in an embodiment of the disclosure.

FIG. 2 is a schematic diagram of a clamping module in an embodiment of the disclosure. Referring to FIG. 1 and FIG. 2 together, specifically, the clamping system 100 described above includes a mechanical arm 110 (FIG. 1) and a clamping module 120. The clamping module 120 is coupled to one end portion 110a of the mechanical arm 110. The clamping module 120 is adapted to clamp one of the memory modules 50 in the sample zone 21 at a time and insert said one of the memory modules 50 into the slot 31 on the to-be-tested motherboard 30. The mechanical arm 110 is adapted to turn around a Z-axis and move between the sample zone 21, the to-be-tested motherboard 30 and the defective sample zone 40, and to move up and down in a Z-axis direction so the clamping module 120 can be slightly lifted up after clamping the memory module 50 to prevent collisions between the mechanical arm 110 and other components (e.g., the tray 22 or the slot 31).

In an embodiment, the clamping module 120 includes a main body 121, two jaw clamps 122 and a blocking pressing plate 123. The main body 121 is fixed on the mechanical arm 110, and the two jaw clamps 122 and the blocking pressing plate 123 are moveably disposed on the main body 121. The two jaw clamps 122 are adapted to move in relative to each other in an X-axis direction. That is to say, the two jaw clamps 122 can move close to each other in the X-axis direction to clamp the memory module 50 and can move away from each other to release the memory module 50.

Figure 3:
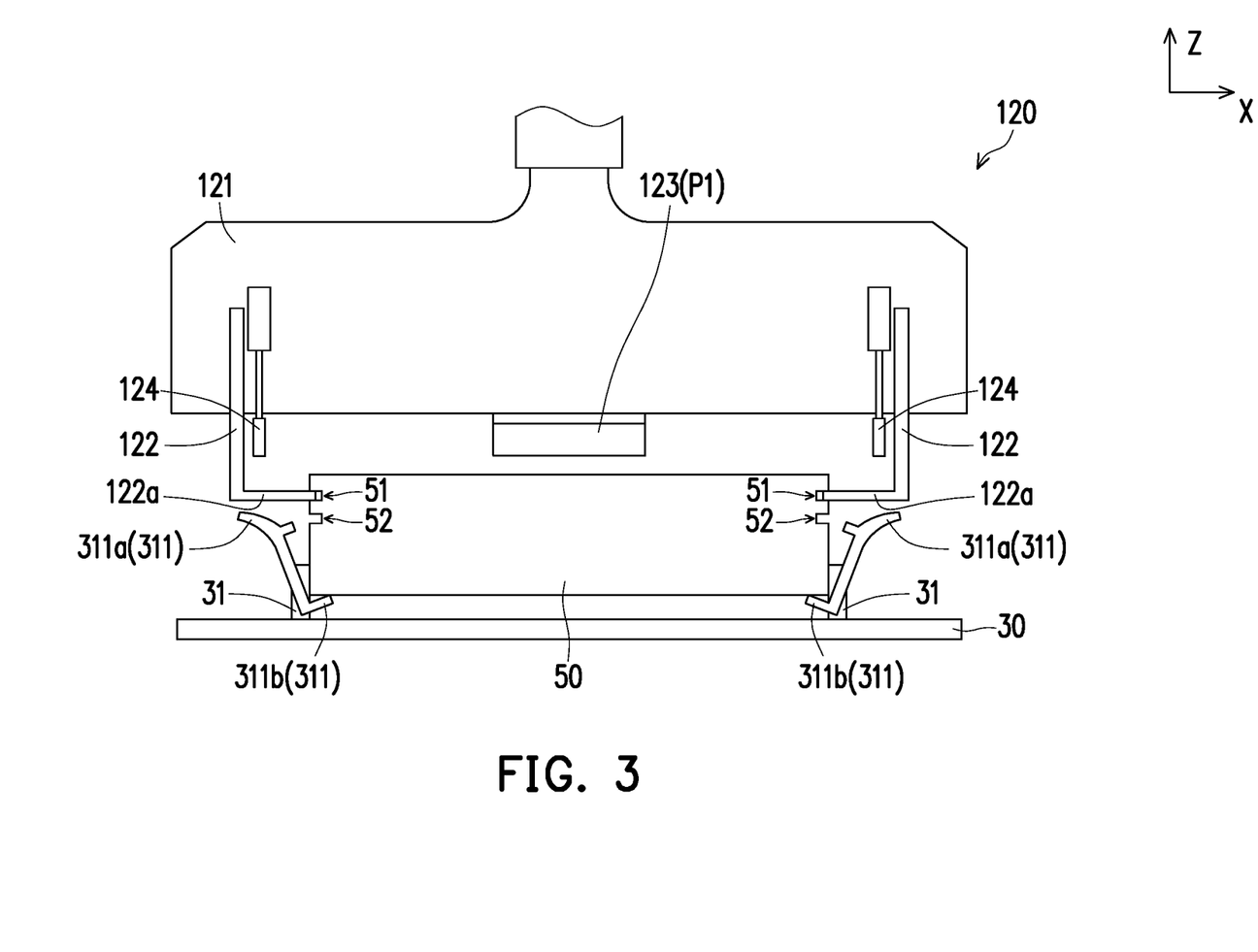
FIG. 3 is a side view of the clamping module of FIG. 2 clamping the memory module to the slot.

FIG. 3 is a side view of the clamping module of FIG. 2 clamping the memory module to the slot. Referring to FIG. 2 and FIG. 3 together, in this embodiment, the memory module 50 has two notches 51 located on two sides of the memory module 50, and each of the two jaw clamps 122 has a protruding end 122a. Accordingly, when the two jaw clamps 122 clamp the memory module 50, the protruding ends 122a can be embedded in the two notches 51 to prevent sliding and shifting between the two jaw clamps 122 and the memory module 50 when the memory module 50 is clamped from causing difficulties in alignment between the memory module 50 and the slot 31.

Figure 4:
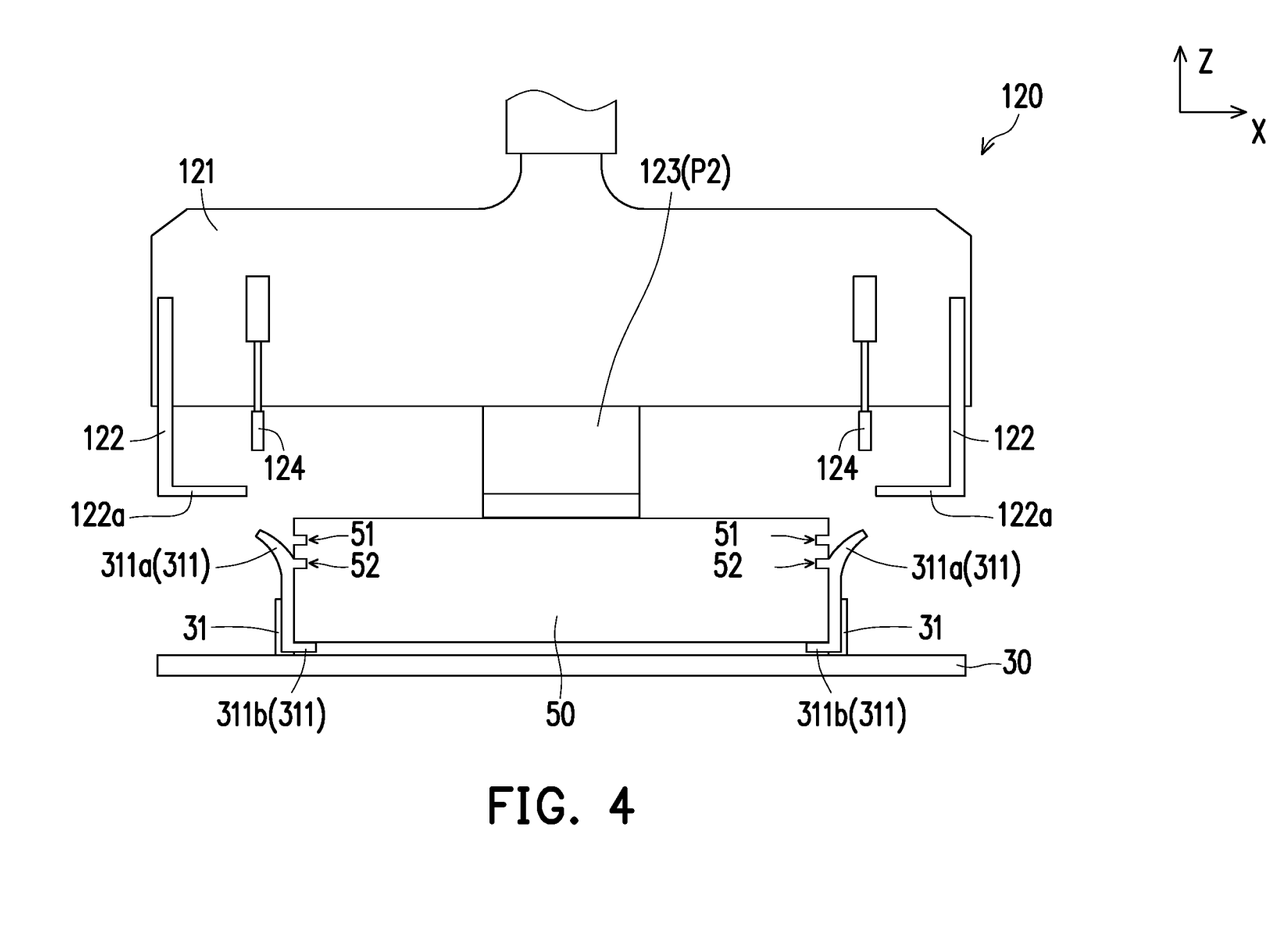
FIG. 4 is a side view of the clamping module of FIG. 2 inserting the memory module into the slot.

FIG. 4 is a side view of the clamping module of FIG. 2 inserting the memory module into the slot. Referring to FIG. 3 and FIG. 4 together, in order to clearly show internal operations in the slot 31, the slot 31 is shown in a cross-sectional view. When the two jaw clamps 122 clamping on the memory module 50 are moved onto the slot 31 of the to-be-tested motherboard 30 through the mechanical arm 110, the mechanical arm 110 moves down along the Z-axis so that the two jaw clamps 122 are adapted to clamp the memory module 50 to a position in contact with the slot 31. At this time, the blocking pressing plate 123 stays at a first position P1. Once the memory module 50 is in contact with the slot 31, the two jaw clamps 122 then move away from each other in the X-axis direction to release the memory module 50 so that the memory module 50 stays at the position in contact with the slot 31.

Referring to FIG. 3 and FIG. 4 together, next, the blocking pressing plate 123 then moves down in the Z-axis direction from the (original) first position P1 to press against and move the memory module 50 to a second position P2. While the blocking pressing plate 123 is moving down, the memory module 50 is pressed down to be completely inserted into the slot 31 and electrically connected to the to-be-tested motherboard 30. It should be noted that, the slot 31 includes two buckle members 311. The two buckle members 311 are rotatably disposed on two sides of the slot 31. One end of each of the two buckle members 311 is an engaging portion 311a located outside the slot 31, and another end of each of the two buckle members 311 is a pushing portion 311b located inside the slot 31. When the memory module 50 is pressed by the blocking pressing plate 123 to move down, the two buckle members 311 rotate in relative to each other in a similar way to seesaw because the pushing portion 311b is pressed. Also, when the memory module 50 is completely inserted in the slot 31, the engaging portions 311a engage with two sides of the memory module 50. In this embodiment, two engaging holes 52 corresponding to protrusions of the two engaging portion 311a are provided on two sides of the memory module 50, for example. When the memory module 50 is completely inserted in the slot 31, the protrusions of the two engaging portions 311a engage with the two engaging holes 52. In this way, the memory module 50 will not move freely on the to-be-tested motherboard 30 so a stability of the memory module 50 during the compatibility test can be improved.

It is worth noting that, the two engaging holes 52 may be absent and replaced by the two notches 51. In detail, in an embodiment not shown, right after clamping the memory module 50 to the position in contact with the slot 31, the two jaw clamps 122 move away from each other to expose the two notches 51. When the memory module 50 is pressed down by the blocking pressing plate 123 to be completely inserted into the slot 31, the engaging portions 311a engage with the notches 51 to achieve an effect of sharing the notches 51 by the jaw clamps 122 and the engaging portions 311a.

Figure 5:
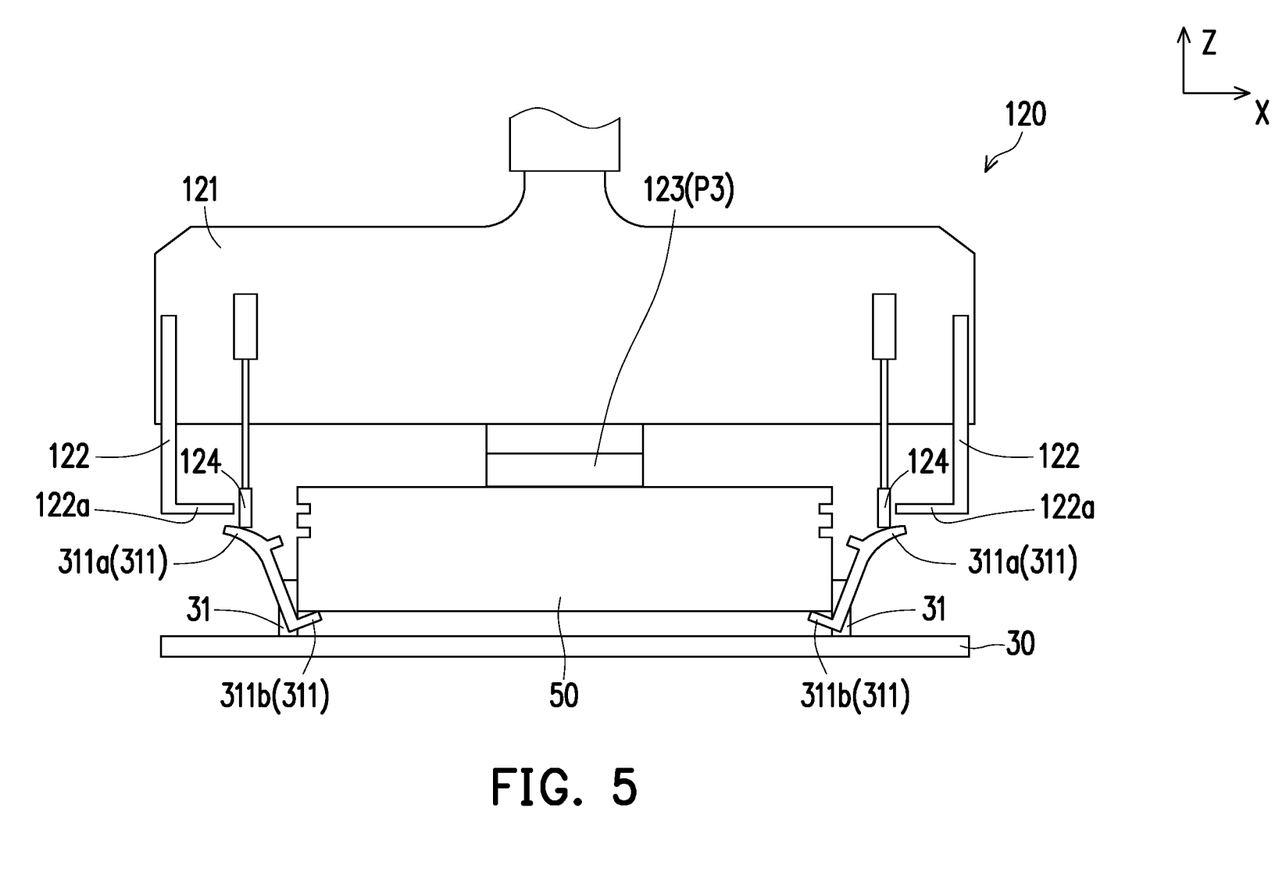
FIG. 5 is a side view of the clamping module of FIG. 2 clamping the memory module from the slot.

FIG. 5 is a side view of the clamping module of FIG. 2 clamping the memory module from the slot. Referring to FIG. 2 and FIG. 5 together, in an embodiment, the clamping module 120 further includes two push rods 124 movably disposed on the main body 121. After the compatibility test between the memory module 50 and the to-be-tested motherboard 30 is completed, the two push rods 124 of the clamping module 120 are adapted to move towards the slot 31 in the Z-axis direction and push against the engaging portions 311a of the two buckle members 311 so that the two buckle members 311 rotate and eject the memory module 50 by the pushing portions 311b. Meanwhile, when the push rods 124 push against the buckle members 311, the blocking pressing plate 123 shifts to a third position P3 between the first position P1 and the second position P2 in the Z-axis direction to limit a height at which the memory module 50 is ejected. Then, the two push rods 124 retract and the two jaw clamps 122 clamp the memory module. It should be noted that, the third position P3 of the blocking pressing plate 123 can make a position of a bottom of the blocking pressing plate 123 equal a position of a top surface of the memory module 50 of FIG. 3. When the memory module 50 is ejected, the blocking pressing plate 123 allows the two notches 51 on the memory module 50 and the protruding ends 122a of the two jaw clamps 122 to be located on the same level height so the two jaw clamps 122 can clamp the memory module 50 smoothly.

In this embodiment, the two jaw clamps 122, the blocking pressing plate 123 and the two push rods 124 installed on the main body 121 of the clamping module 120 may operate in the X-axis and Z-axis directions by a transmission with solenoid valve, gas valve or gear drive, which are not particularly limited by the disclosure.

Figure 6:
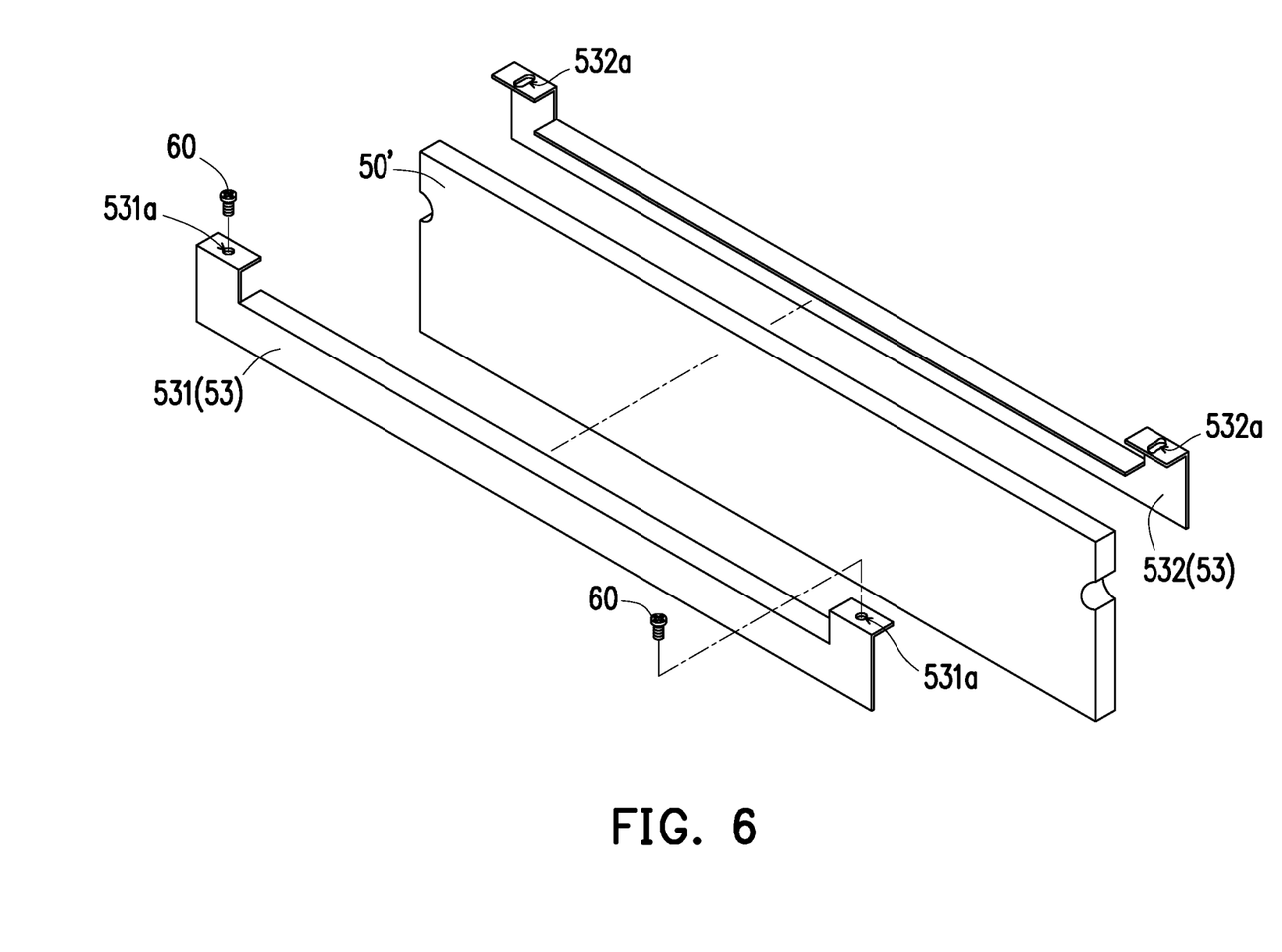
FIG. 6 is an explosion schematic view of a shell cover and a memory module in another embodiment of the disclosure.

FIG. 6 is an explosion schematic view of a shell cover and a memory module in another embodiment of the disclosure. With reference to FIG. 6, due to structural differences, the memory modules produced by different manufacturers may not all be clamped easily (e.g., the notches 51 of the memory module 50 may not be included, or may have different thicknesses). Accordingly, in an embodiment of the disclosure, a memory module 50' includes a shell cover 53. The shell cover 53 includes a first part 531 and a second part 532, and the first part 531 and the second part 532 may be combined together and fixed onto the memory module 50' and may encase at least part of the memory module 50'. Here, the first part 531 has holes 531a, and the second part 532 has slide openings 532a. After being combined together, the first part 531 and the second part 532 of the shell cover 53 may be locked to each other by passing screws 60 through the holes 531a and the slide openings 532. In addition, the second part 532 having the slide openings 532a can control a width of the first part 531a and the second part 532a combined together to accommodate the memory modules 50' manufactured by different manufacturers.

Further, because the cover 53 has a fixed shape, the clamping module can simply clamp on the shell cover 53 fixed on the memory module 50'. For example, the clamping module can clamp the shell cover 23 and the memory module 50' in width. Accordingly, it is not required to change the design of the clamping module 120 for the memory module 50' of a particular structure.

Referring back to FIG. 1, an automated process of the memory module testing assembly 10 of the disclosure may be, for example, the compatibility test between memory module 50 and the to-be-tested motherboard 30 performed according to the following process.

The memory module testing assembly 10 further includes a main console (not shown), and the main console is adapted to receive and transmit signals from/to the to-be-tested motherboard 30 by the clamping system 100. First, after an operator operates the main console to confirm the number of the memory modules 50 (e.g., one, two, four or eight) to be tested by the to-be-tested motherboard 30, the main console sends commands to control the mechanical arm 110 to move onto the tray 22 of the sample zone 21 and control the clamping module 120 to clamp the memory module 50. While the memory module 50 is being clamped, the mechanical arm 110 simultaneously transmits an item number (not shown) on the memory module 50 back to the main console through a scanner (not shown) so that a model name or a model type of the memory module 50 may be confirmed. Here, the scanner is, for example, disposed on the mechanical arm 110 or disposed at a position reachable by the mechanical arm 110, and the item number is, for example, provided at one side of the memory module 50 in form of one-dimensional barcode. However, the disclosure is not limited in this regard.

Then, the mechanical arm 110 moves the memory module 50 onto the slot 31 of the to-be-tested motherboard 30 so the clamping module 120 can insert the memory module 50 into the slot 31 (e.g., as shown by FIG. 3 to FIG. 4). Once an insertion of the memory module 50 on the to-be-tested motherboard 30 is completed, the to-be-tested motherboard 30 can then transmit an insertion-completed signal back to the main console. After receiving that signal, the main console transmits a signal to the to-be-tested motherboard 30 to turn on a testing power of the to-be-tested motherboard 30 and execute compatibility testing programs.

During the test, the to-be-tested motherboard 30 transmits a testing result to the main console, and the main console determines whether the tested memory module 50 is normal. After the test is completed, the to-be-tested motherboard 30 turns off the testing power, and the main console then determines whether the number of the memory modules 50 on the to-be-tested motherboard 30 needs to be changed. If so, the mechanical arm 110 is moved onto the slot 31 of the to-be-tested motherboard 30, and the memory module 50 (e.g., in FIG. 5) on the slot 31 is clamped by the clamping module 120. Or, depending on the commands transmitted by the main console, more of the memory modules 50 on the tray 22 may be clamped and inserted into the other slots 31 on the to-be-tested motherboard 30, the testing power of the to-be-tested motherboard 30 may be turned on to execute the compatibility testing programs. Otherwise, the mechanical arm 110 is moved onto the slot 31 of the to-be-tested motherboard 30, the memory module 50 on the slot 31 is clamped by the clamping module 120, and whether the mechanical arm 110 needs to clamp the tested memory module 50 to the defective sample zone 40 or to the tray 22 of the sample zone 21 is determined depending on the result of whether the memory module 50 is normal as determined by the main console.

At this point, the entire compatibility testing process is completed. The main console then sends, for example, a warning signal to notify the operator to confirm the result.

Next, the production line 20 can drive the next set of the memory modules 50 to be tested and the tray 22 thereof to move to the sample zone 21 so the next compatibility test can be performed according to the steps above.

In summary, the clamping module and the clamping system according to the embodiments of the disclosure adopt the two jaw clamps for clamping the memory module together with the blocking pressing plate and the push rods for replacing the operation of manually inserting the memory module into the slot. Moreover, the operation of repeatedly and manually clamping or releasing the memory module is performed by the mechanical arm instead. As a result, not only can the manpower input be reduced, the time required for the testing process may also be reduced due to regular and precise mechanical operation.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

The invention claimed is:

1. A clamping module comprising:
   a slot;
   a memory module, inserted into or removed from the slot;
   a main body;
   two jaw clamps, movably disposed on the main body, wherein the two jaw clamps move in relative to each other to clamp or release the memory module;
   a blocking pressing plate, movably disposed on the main body,
   wherein after the two jaw clamps clamp the memory module to a position in contact with the slot, the two jaw clamps move away from each other so that the memory module is released, and the blocking pressing plate moves from a first position to a second position in order to press the memory module so that the memory module is inserted into the slot; and
   two push rods, movably disposed on the main body,
   wherein two buckle members are rotatably disposed on two sides of the slot so as to fix the memory module inserted in the slot or push the memory module away from the slot,
   and when the memory module is inserted in the slot, the two push rods move in a direction towards the slot and push against the two buckle members so that the memory module is ejected,
   wherein when the two push rods push against the two buckle members of the slot, the pushing pressing plate is located at a third position between the first position and the second position to limit a height at which the memory module is ejected.

2. The clamping module according to claim 1, wherein the memory module has two notches, and the two jaw clamps are inserted in the two notches to clamp the memory module.

3. The clamping module according to claim 1, wherein a shell cover is fixed on the memory module and encases at least part of the memory module, and the two jaw clamps clamp the shell cover fixed on the memory module.

4. A clamping system, comprising:
   a slot;
   a memory module, inserted into or removed from the slot;
   a mechanical arm, adapted to move along at least two axes; and
   a clamping module, coupled to the mechanical arm, wherein the clamping module comprises:
   a main body, fixed on the mechanical arm;
   two jaw clamps, movably disposed on the main body, wherein the two jaw clamps move in relative to each other to clamp or release the memory module;
   a blocking pressing plate, movably disposed on the main body,
   wherein after the two jaw clamps clamp the memory module to a position in contact with the slot, the two jaw clamps move away from each other so that the memory module is released, and the blocking pressing plate moves from a first position to a second position in order to press the memory module so that the memory module is inserted into the slot; and
   two push rods, movably disposed on the main body,
   wherein two buckle members are rotatably disposed on two sides of the slot so as to fix the memory module inserted in the slot or push the memory module away from the slot, and when the memory module is inserted in the slot, the two push rods move in a direction towards the slot and push against the two buckle members so that the memory module is ejected,
   wherein when the two push rods push against the two buckle members of the slot, the pushing pressing plate is located at a third position between the first position and the second position to limit a height at which the memory module is ejected.

5. The clamping system according to claim 4, wherein the memory module has two notches, and the two jaw clamps are inserted in the two notches to clamp the memory module.

6. The clamping system according to claim 4, wherein a shell cover is fixed on the memory module and encases at least part of the memory module, and the two jaw clamps clamp the shell cover fixed on the memory module.

* * * * *